(12) United States Patent
Ohta

(10) Patent No.: US 7,468,552 B2
(45) Date of Patent: Dec. 23, 2008

(54) PHYSICAL QUANTITY SENSOR

(75) Inventor: Tameharu Ohta, Takahama (JP)

(73) Assignee: DENSO CORPORATION, Kariya (JP)

( * ) Notice: Subject to any disclaimer, the term of this patent is extended or adjusted under 35 U.S.C. 154(b) by 100 days.

(21) Appl. No.: 11/208,603

(22) Filed: Aug. 23, 2005

(65) Prior Publication Data

US 2006/0049497 A1 Mar. 9, 2006

(30) Foreign Application Priority Data

Sep. 8, 2004 (JP) ............................ 2004-260730

(51) Int. Cl.
*H01L 23/02* (2006.01)
(52) U.S. Cl. .............................. 257/686; 257/E25.006
(58) Field of Classification Search ................ 257/678, 257/690, 732, 735, 784, 686, 734, 777, 778, 257/779, 786, 723, 731, E25.004, E25.006; 438/106–127
See application file for complete search history.

(56) References Cited

U.S. PATENT DOCUMENTS

| | | | | |
|---|---|---|---|---|
| 6,005,778 A | * | 12/1999 | Spielberger et al. | ......... 361/770 |
| 6,236,109 B1 | * | 5/2001 | Hsuan et al. | ................. 257/688 |
| 6,249,046 B1 | * | 6/2001 | Hashimoto | ................... 257/691 |
| 6,848,306 B2 | * | 2/2005 | Kunda | ...................... 73/514.01 |
| 6,911,721 B2 | * | 6/2005 | Aoyagi | ........................ 257/678 |
| 7,023,076 B2 | * | 4/2006 | Khiang | ........................ 257/678 |
| 7,081,373 B2 | * | 7/2006 | Roeters et al. | .............. 438/109 |
| 2004/0182157 A1 | | 9/2004 | Sakai et al. | |
| 2005/0104186 A1 | * | 5/2005 | Yang et al. | ................... 257/688 |

FOREIGN PATENT DOCUMENTS

JP  A-9-219423  8/1997

\* cited by examiner

*Primary Examiner*—W. David Coleman
*Assistant Examiner*—Khiem D Nguyen
(74) *Attorney, Agent, or Firm*—Posz Law Group, PLC

(57) ABSTRACT

A physical quantity sensor includes a package, a circuit chip disposed and held in the package, a sensor chip stacked and fixed on the circuit chip, and a wiring member having flexibility, through which the circuit chip and the package are electrically and mechanically bonded together. In the physical quantity sensor, unwanted external vibrations transmitted to the sensor chip are reduced without an external vibration dumping system such as a rubber pad, because the wiring member weakens the vibrations.

9 Claims, 6 Drawing Sheets

PHYSICAL QUANTITY SENSOR

CROSS REFERENCE TO RELATED APPLICATION

This application is based on Japanese Patent Application No. 2004-260730 filed on Sep. 8, 2004, the disclosure of which is incorporated herein by reference.

FIELD OF THE INVENTION

The present invention relates to a physical quantity sensor.

BACKGROUND OF THE INVENTION

A physical quantity sensor such as acceleration sensor and angular velocity sensor having a sensor chip mounted face down on a substrate is known (refer to, for example, JP-A-9-219423).

Using a face down mounting method, the mounting area of the chip can be reduced and the sensor size can be decreased correspondingly.

The inventor has advanced the development of a physical quantity sensor having a sensor chip and a circuit chip for processing signals from the sensor chip. In the physical quantity sensor, the sensor chip and the circuit chip are stacked in order to reduce the mounting area so that the manufacturing cost is reduced.

On the basis of a technical idea disclosed in JP-A-9-219423, the inventor has adopted the face down mounting method to develop a sensor having stacked chips and has made a prototype of the sensor.

FIG. 6A is a schematic plan view showing the prototype, and FIG. 6B is a schematic cross sectional view showing the prototype.

A package 100 is composed of multiple layers of alumina or the like. A wiring (not shown) is formed on the surface of the package 100 and inside the package 100. Through the wiring, the sensor can be electrically connected to an external circuit.

A sensor chip 200 detects physical quantity (mechanical quantity) such as acceleration, angular velocity, and pressure. The sensor chip 200 can be constructed, for example, by forming a diaphragm and movable parts on a semiconductor substrate. A circuit chip 300 is a signal-processing chip for the sensor chip 200. The circuit chip 300 is typically constructed as an integrated circuit (IC) chip.

As shown in FIG. 6B, the sensor chip 200 and the circuit chip 300 are stacked and bonded through bumps 500. The stacked body of the chip 200 and the chip 300 is mounted face down on the package 100 through the bumps 500 formed around the periphery of the circuit chip 300.

Since the bumps 500 have high stiffness, unwanted external vibrations are transmitted to the sensor chip 200 through the bumps 500 without being weakened. Therefore, the package 100 requires an external system such as a rubber pad for reducing vibration.

As described above, although the package 100 can be minimized, a rubber pad for vibration damping is attached around the package 100 in practical use as a sensor. Consequently, the whole size of the sensor including the rubber pad becomes larger and size advantage of the package 100 cannot be exploited.

SUMMARY OF THE INVENTION

In view of the above-described problem, it is an object of the present invention to provide a physical quantity sensor capable of decreasing external vibrations without increasing its size. The physical quantity sensor includes a package, a circuit chip contained and held in the package, and a sensor chip stacked and fixed on the circuit chip. The package and the circuit chip are electrically and mechanically bonded through a flexible wiring member in tape form.

In the sensor, bonding area between the circuit chip and the package is flexible. Therefore, even if unwanted external vibrations are applied to the sensor, the vibrations can be weaken through the interface. Less vibration is transmitted to the circuit chip without an external system for reducing vibrations. Therefore, the sensor chip is prevented from unwanted external vibrations.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
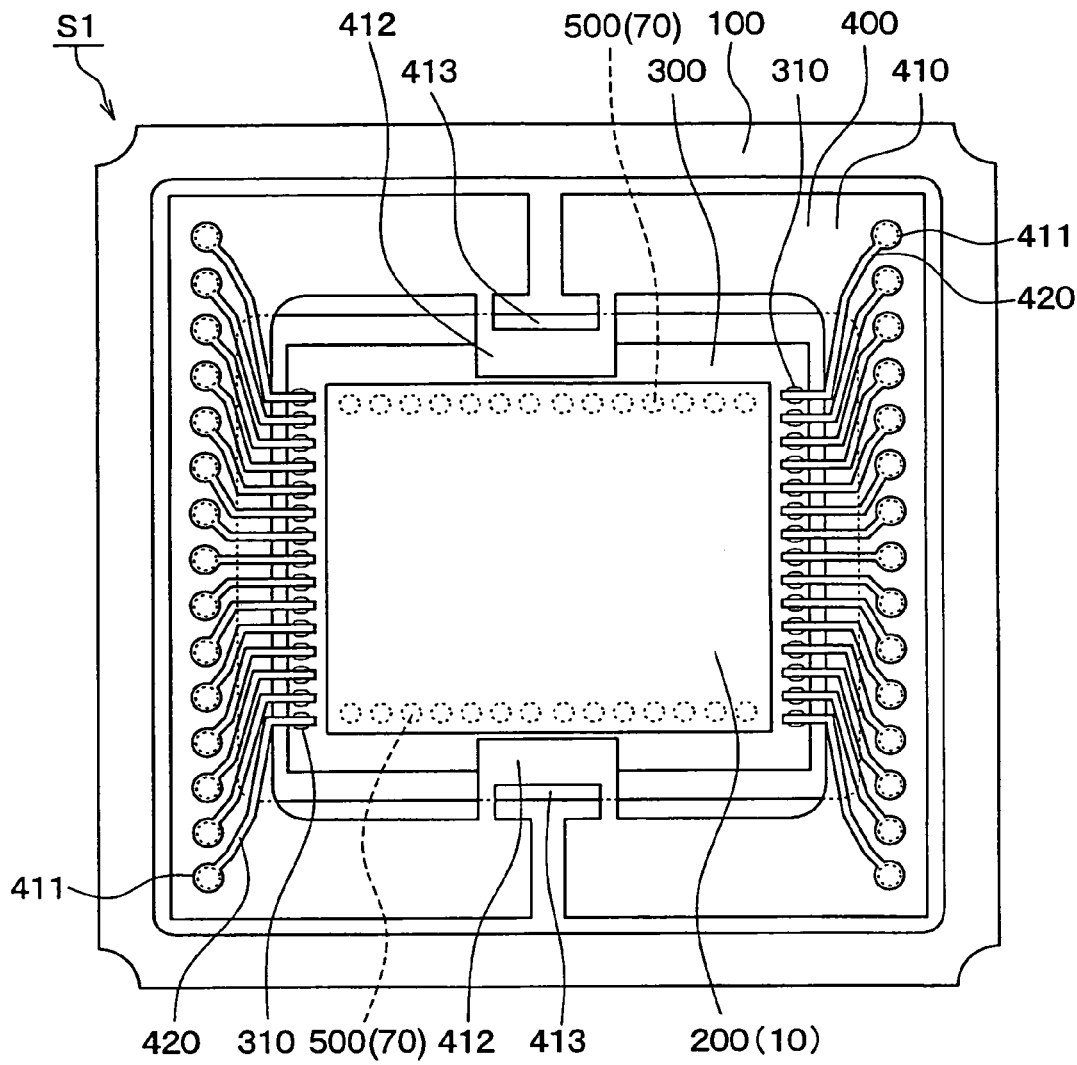
FIG. 1A is a schematic plan view showing an angular velocity sensor according to a first embodiment of the present invention.
Figure 1B:
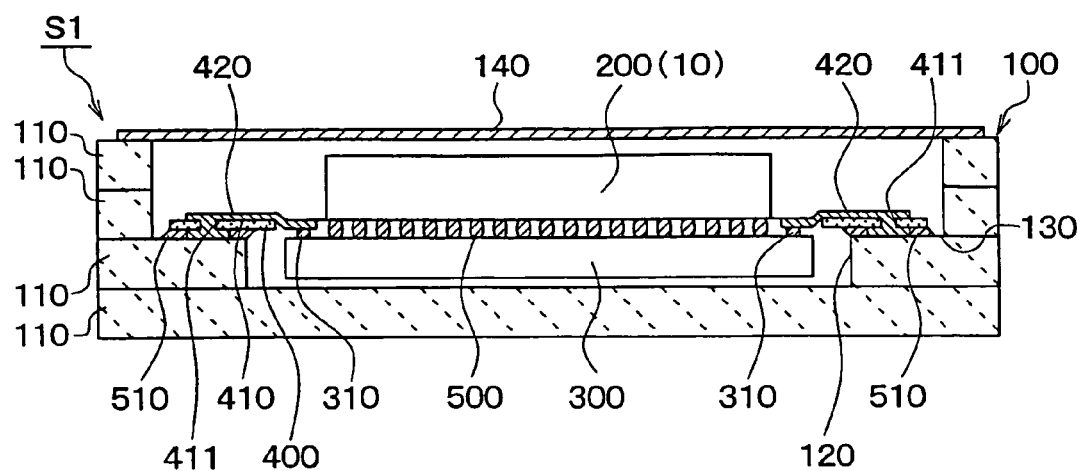
FIG. 1B is a cross sectional view showing the sensor according to the first embodiment.

An angular velocity sensor S1 according to a first embodiment of the present invention is shown in FIGS. 1A and 1B. The angular velocity sensor S1 includes a package 100, a circuit chip 300 contained and held in the package 100, and a sensor chip 200 for detecting angular velocity. The sensor chip 200 is stacked and fixed on the circuit chip 300. The package 100 and the circuit chip 300 are electrically and mechanically bonded through a wiring member 400 having flexibility. The wiring member 400 is in a tape form.

The package 100 accommodates the sensor chip 200 and the circuit chip 300. Further, the package 100 provides a base of the sensor S1. Furthermore, the package 100 works as an attachment for mounting the sensor S1 to an object.

The package 100 is constructed as a multilayer substrate of ceramic films 110 such as an alumina film. In the package 110, through holes are formed to penetrate each layer of the ceramic films 110. The package 100 has wiring portions (not shown) on each layer of the ceramic films 110 and in the through holes. The sensor S1 can be connected to an external circuit through the wiring portions.

The package 100 has a hollow space 120 in the bottom to accommodate the circuit chip 300. A stage 130 is formed around the hollow space 120. The stage 130 is an area to install the wiring member 400 to the package 100. A lid 140 is attached over an opening of the package 100 by welding or brazing so that the inside of the package 100 is sealed.

Figure 2:
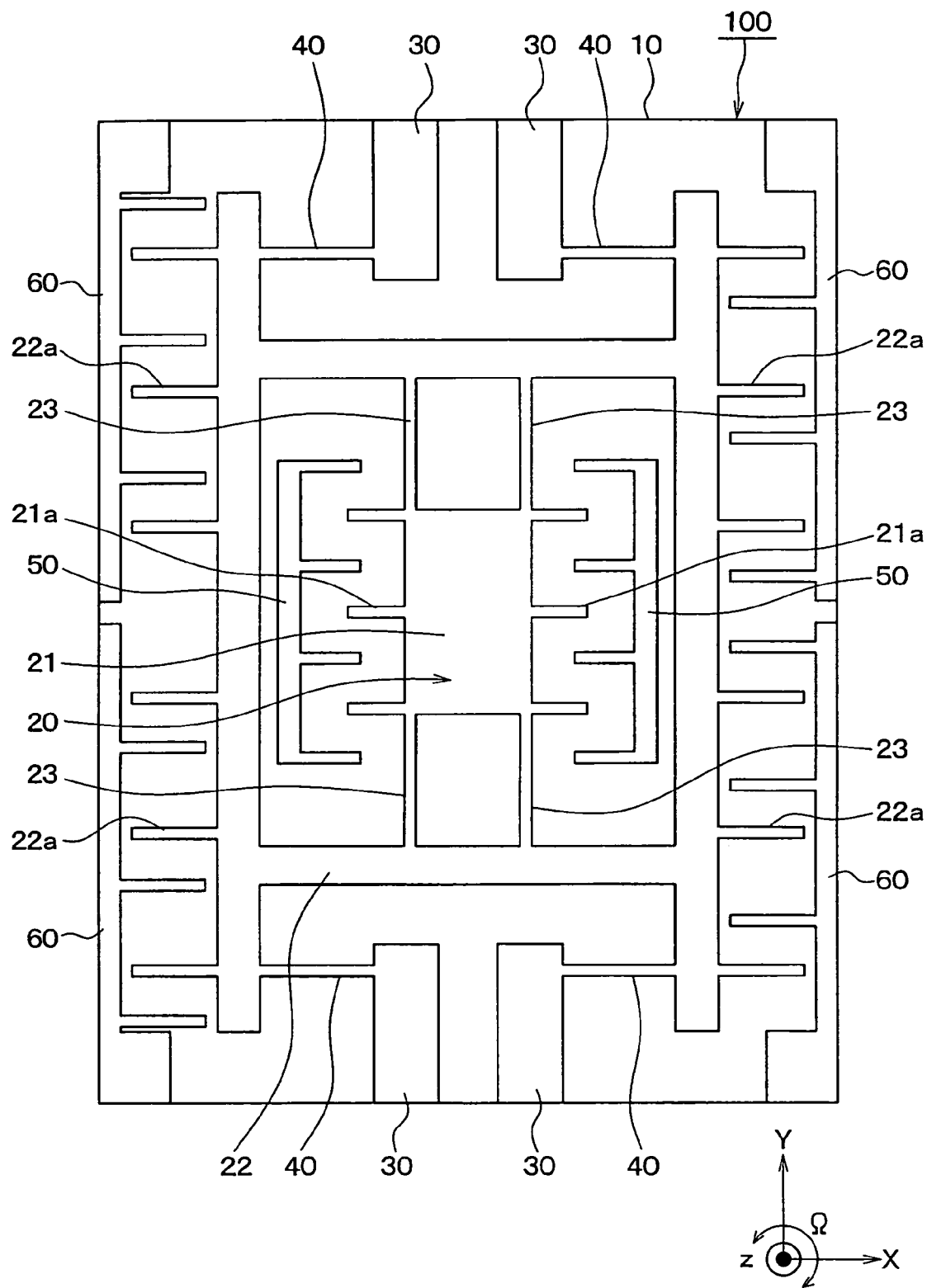
FIG. 2 is a plan view showing a sensor chip used in the sensor according to the first embodiment.

FIG. 2 shows the sensor chip 200. The sensor chip 200 has a substrate 10 (e.g., a semiconductor substrate) and is formed by micromachining the substrate 10. A silicon-on-insulator (SOI) substrate in rectangle shape can be used as the substrate 10. The SOI substrate is composed of the first silicon layer, the second silicon layer laminated on the first silicon layer and an oxide film as an insulating layer interposed between the two silicon layers.

As shown in FIG. 2, beam structures are composed of a vibrating member 20, driving beams 23, sensing beams 40, and electrodes 50,60. The beam structures are separated by trenches and can be formed by performing a trench etching process and a release etching process and the like on the top layer of the substrate 10, for example, the second silicon layer of the SOI substrate.

In the center of the substrate 10, the vibrating member 20 is capable of vibrating in a direction parallel to the substrate 10. The vibrating member 20 includes the first vibrating portion 21, the second vibrating portion 22, and driving beams 23. The first vibrating portion 21 has an almost rectangular shape and located in the center of the substrate 10. The second vibrating portion 22 provides a rectangular frame and encloses the first vibrating portion 21. The first and the second vibrating portions are joined together through the driving beams 23.

The vibrating member 20 is joined to anchors 30 through the sensing beams 40. The anchors 30 are fixed and supported on the base of the substrate 10, for example, the first silicon layer of the silicon-on-insulator (SOI) substrate. Therefore, the vibrating member 20 is separated from the base of the substrate 10.

As shown in FIG. 2, when the driving beams 23 extend in the Y direction, the driving beams 23 are elastically deformable almost only in the X direction. Likewise, when the sensing beams 40 have a shape extending in the X direction the sensing beams 40 can be elastically deformed almost only in the Y direction.

The driving beams 23 allow the first vibrating portion 21 of the vibrating member 20 to vibrate in the X direction (i.e., the direction of driving vibration), which is parallel to the substrate 10. Likewise, the sensing beams 40 allow the whole vibrating member 20 to vibrate in the Y direction (i.e., the direction of sensing vibration), which is parallel to the substrate 10.

A pair of driving electrodes 50 is formed between the first vibrating portion 21 and the second vibrating portion 22. The driving electrodes 50 vibrate the first vibrating portion 21 in the X direction. Similar to the anchors 30, the driving electrodes 50 are fixed on the base of the substrate 10. The first vibrating portion 21 and the driving electrodes 50 face each other. The first vibrating portion 21 has comb-teeth portions 21a extending toward the driving electrodes 50. The driving electrodes 50 have comb-teeth electrode portions extending toward the first vibrating portion 21. The comb-teeth electrode portions of the driving electrodes 50 are interleaved with the comb-teeth portions 21a of the first vibrating portion 21.

Sensing electrodes 60 are formed on the outside of the second vibrating portion 22. The sensing electrodes 60 detect angular velocity around the Z-axis perpendicular to the substrate 10 by using the vibration of the vibrating member 20. Similar to the anchors 30, the sensing electrodes 60 are fixed on the base of the substrate 10. The second vibrating portion 22 and the sensing electrodes 60 face each other. The second vibrating portion 22 has comb-teeth portions 22a extending toward the sensing electrodes 60. The sensing electrodes 60 have comb-teeth electrode portions extending toward the second vibrating portion 22. The comb-teeth electrode portions of the sensing electrodes 60 are interleaved with the comb-teeth portions 22a of the second vibrating portion 22.

In the sensor chip 200, multiple pads 70 are formed on a predetermined portion of the substrate 10. Through the pads 70, voltage is applied to the vibration member 20, the driving electrodes 50, and the sensing electrodes 60. Further, signals are outputted from the vibration member 20, the driving electrodes 50, and the sensing electrodes 60 through the pads 70.

In this embodiment, the pads 70 are formed on the periphery of the substrate 10, as shown in FIG. 1A. The pads 70 are connected to bumps 500, which are made of gold (Au), solder or the like.

The sensor chip 200 and the circuit chip 300 are stacked. Specifically, the sensor chip 200 is mounted face down on the circuit chip 300. The sensor chip 200 and the circuit chip 300 are electrically and mechanically bonded through the bumps 500.

The circuit chip 300 is an integrated circuit (IC) chip, which is typically fabricated by forming a metal oxide semiconductor (MOS) transistor or a bipolar transistor on a silicon substrate using a common semiconductor manufacturing process. The circuit chip 300 may have the function of transmitting electrical power to the sensor chip 200, processing electrical signals from the sensor chip 200, and producing outputs to an external circuit.

The circuit chip 300 and the package 100 are electrically and mechanically bonded through the wiring member 400 having flexibly. The wiring member 400 is in tape form.

In this embodiment, the wiring member 400 is formed of a carrier tape for a TAB method.

The wiring member 400 includes a flexible tape 410 and multiple leads 420 bonded on the flexible tape 410.

The flexible tape 410 is made of a flexible material such as polyimide. The flexible tape 410 provides a rectangle flame so that the circuit chip 300 is enclosed with the flexible tape 410.

The leads 420 are made of a conductive material such as a copper sheet. The leads 420 are bonded and fixed on one surface of the flexible tape 410.

One end of each lead 420 sticks out from the inner edge of the tape 410. The other end of each lead 420 is exposed to the other surface from the one surface of the flexible tape 410 through holes 411, which are formed in the flexible tape 410.

The wiring member 400 is bonded and fixed on the stage 130 of the package 100 through bonding members 510 around the outer perimeter of the tape 410. The tape 410 has overhanging portion 412 which projects from the inner edge of the tape 410 toward the circuit chip 300.

The tape 410 and the circuit chip 300 are bonded together at the overhanging portion 412 through an adhesive material (not shown) or the like. Each overhanging portion 412 has a slit 413 so that surface area of the overhanging portion 412 is reduced.

One end of each lead 420 is electrically connected to a pad 310 by a press-bonding method. The pad 310 can be formed of a bump or the like. Thus, multiple leads 420 and multiple pads 310 are electrically bonded, respectively.

The other end of each lead 420 is attached to wiring portion (not shown) by a press bonding method. The wiring portions are formed on the stage 130 of the package 100.

Thus, the circuit chip 300 and the package 100 are mechanically bonded through the tape 410 and electrically bonded through the leads 420.

Specifically, the circuit chip 300 and the package 100 are electrically and mechanically bonded through the wiring member 400. Output signals from the circuit chip 300 are transmitted to an external circuit through the wiring portions of the package 100 and the wiring member 400.

As shown in FIG. 1A, the overhanging portion 412 includes a rectangular body and a pair of beams. The rectangular body is connected to the inner edge of the tape 410 through the beams. The structure of the overhanging portion 412 can be suitably changed.

The angular velocity sensor S1 can be manufactured as follows.

Firstly, the sensor chip 200 is mounted face down on the circuit chip 300 using a flip-chip bonding method. Then, the circuit chip 300 is mounted on the wiring member 400 using the TAB method.

Secondly, the wiring member 400 is cut to be a proper size so that the package 100 can accommodate the wiring member 400. Then, the wiring member 400 is fixed inside the package 100.

Finally, the package 100 is sealed with the lid 140, and the sensor S1 is completed.

Sensing operation of the sensor S1 will be now described with reference to FIG. 2.

Driving signals (e.g., sine-wave voltages) from the circuit chip 300 are applied to the driving electrodes 50 of the sensor chip 200 through the bumps 500. Therefore, electrostatic force is generated between the comb-teeth portions 21a of the first vibrating portion 21 and the comb-teeth electrodes of the driving electrodes 50. Then, the first vibrating portion 21 vibrates in the X direction due to elastic force of the driving beams 23.

When angular velocity Ω is applied around the Z-axis while the first vibrating portion 21 vibrates, Coriolis force is exerted on the first vibrating portion 21 in the Y direction. Then, the whole vibrating member 20 vibrates in the Y direction due to elastic force of the sensing beams 40.

Consequently, capacitance between the comb-teeth portions 22a of the second vibrating portion 22 and the comb-teeth electrode portions of the sensing electrodes 60 varies. By detecting the capacitance change, the sensor S1 can detect the angular velocity Ω.

Specifically, when the vibrating member 20 moves in one direction along with the Y-axis, capacitance in the left electrode of the sensing electrodes 60 changes inversely with capacitance in the right electrode of the sensing electrodes 60. For example, when capacitance in the right electrode increases, capacitance in the left electrode decreases. The capacitance changes in the right and left electrodes are converted to voltages. Then, difference between the voltages is amplified and outputted. By detecting the difference, the sensor S1 can detect the angular velocity Ω.

As described previously, the angular velocity sensor S1 includes the package 100, the circuit chip 300 contained and held in the package 100. The sensor chip 200 is stacked and fixed on the circuit chip 300. In the sensor S1, the circuit chip 300 and the package 100 are electrically and mechanically bonded through the wiring member 400.

Even if unwanted external vibrations are applied to the sensor S1, the vibrations can be weakened through the wiring member 400 between the circuit chip 300 and the package 100. That is because the wiring member 400 is flexible. Consequently, less vibration is transmitted to the circuit chip 300 without an external system such as a rubber pad for preventing vibration for the package 100. The vibrations transmitted to the sensor chip 200 are reduced accordingly.

Therefore, the sensor S1 can greatly decrease unwanted external vibrations transmitted to the sensor chip 200 without increasing its size and without adding external systems.

In addition, the wiring member 400 encloses the circuit chip 300 and has overhanging portions 412, which projects from the inner edge of the wiring member 400 toward the circuit chip 300. The wiring member 400 and the circuit chip 300 are bonded together at the overhanging portions 412.

The wiring member 400 and the circuit chip 300 are partially bonded, and therefore size of the bonding area can be reduced. Stiffness of the bonding area can be reduced and flexibility of the bonding area can be increased accordingly.

Furthermore, the overhanging portions 412 of the wiring member 400 have the slits 413. The slits 413 reduce the bonding area appropriately, and therefore flexibility of the bonding area can be suitably improved.

When the circuit chip 300 is bonded to the wiring member 400 through the overhanging portion 412 having the slits 413, stiffness of the bonding area can be reduced due to the small bonding area. Further, the size of the bonding area can be easily reduced after the circuit chip 300 and the wiring member 400 are bonded together. Furthermore, spring characteristics, i.e., elasticity can be produced in the bonding area between the wiring member 400 and the circuit chip 300.

Figure 3:
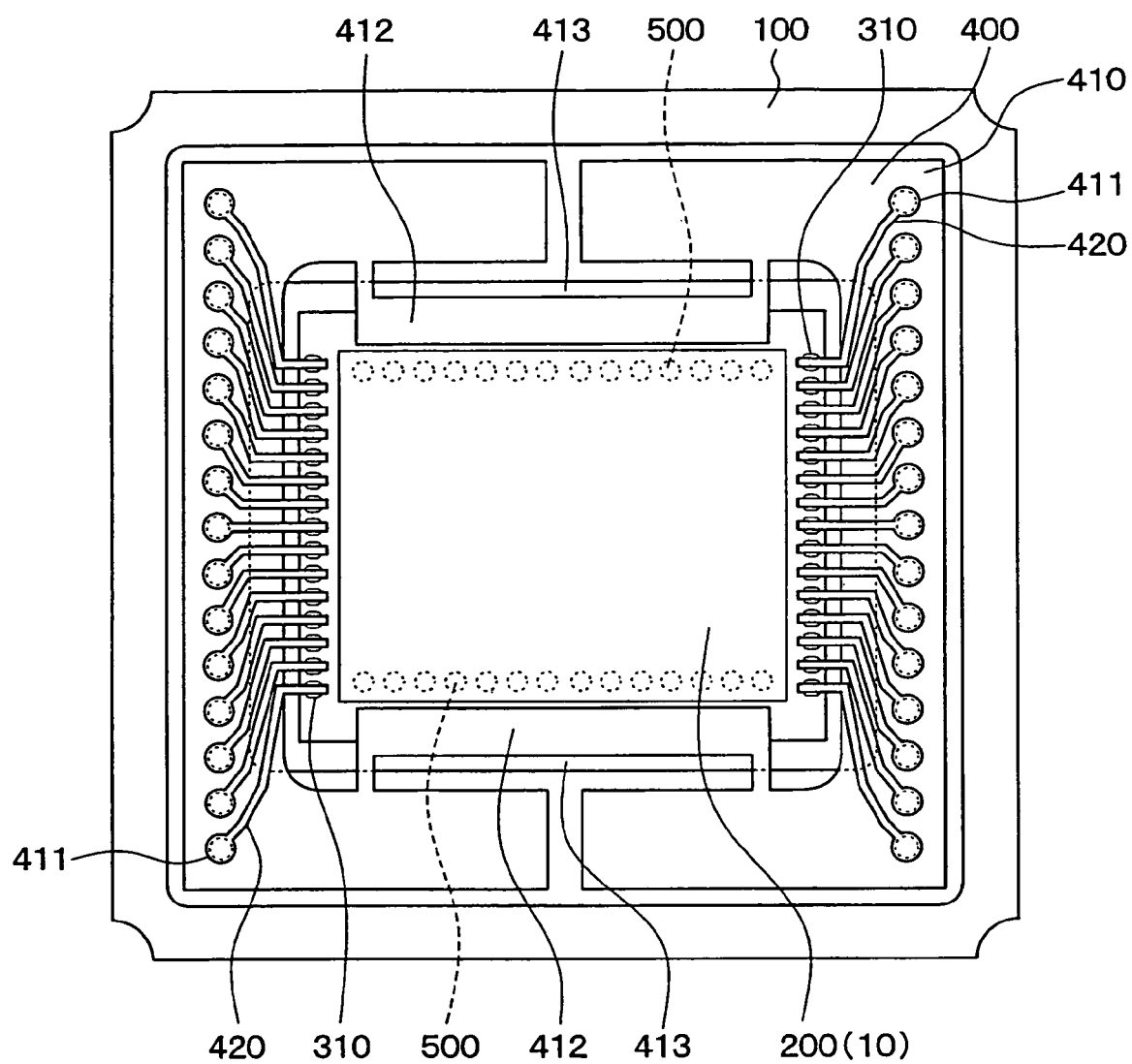
FIG. 3 is a plan view showing a modification of the sensor according to the first embodiment, in which overhanging portions and slits are modified.
Figure 4:
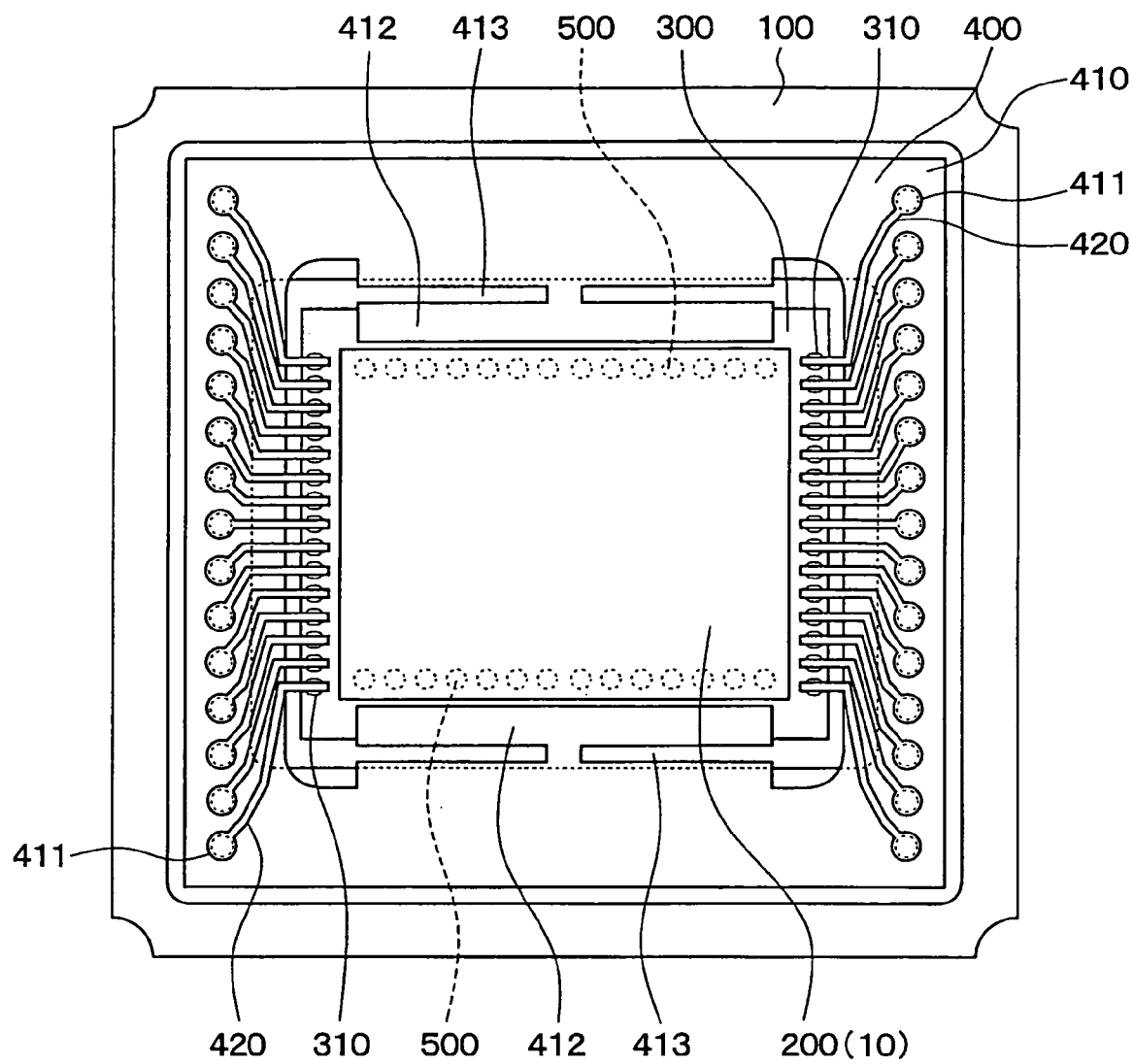
FIG. 4 is a plan view showing another modification of the sensor according to the first embodiment, in which overhanging portions and slits are modified.

The spring characteristics depend on the shape of the overhanging portion 412 and the position, the width and the depth of the slit 413. Therefore, the spring characteristics can be suitably controlled. Examples of modifications of the overhanging portions 412 and the slits 413 are shown in FIGS. 3 and 4. By changing the spring characteristics of the bonding area, structural resonance frequency, which is determined by the masses of the sensor chip 200 and the circuit chip 300, can be adjusted. Specifically, resonance frequency in spring mass system, which is determined by mass of the sensor chip 200 and the circuit chip 300 and the spring constant of the wiring member 400, can be adjusted.

In this embodiment, the sensor chip 200 is a vibrating type sensor. In this case, in the driving frequency, external vibrations transmitted to the sensor chip 200 can be reduced by lowering the structural resonance frequency than the driving frequency of the vibration member 20.

Second Embodiment

Figure 5:
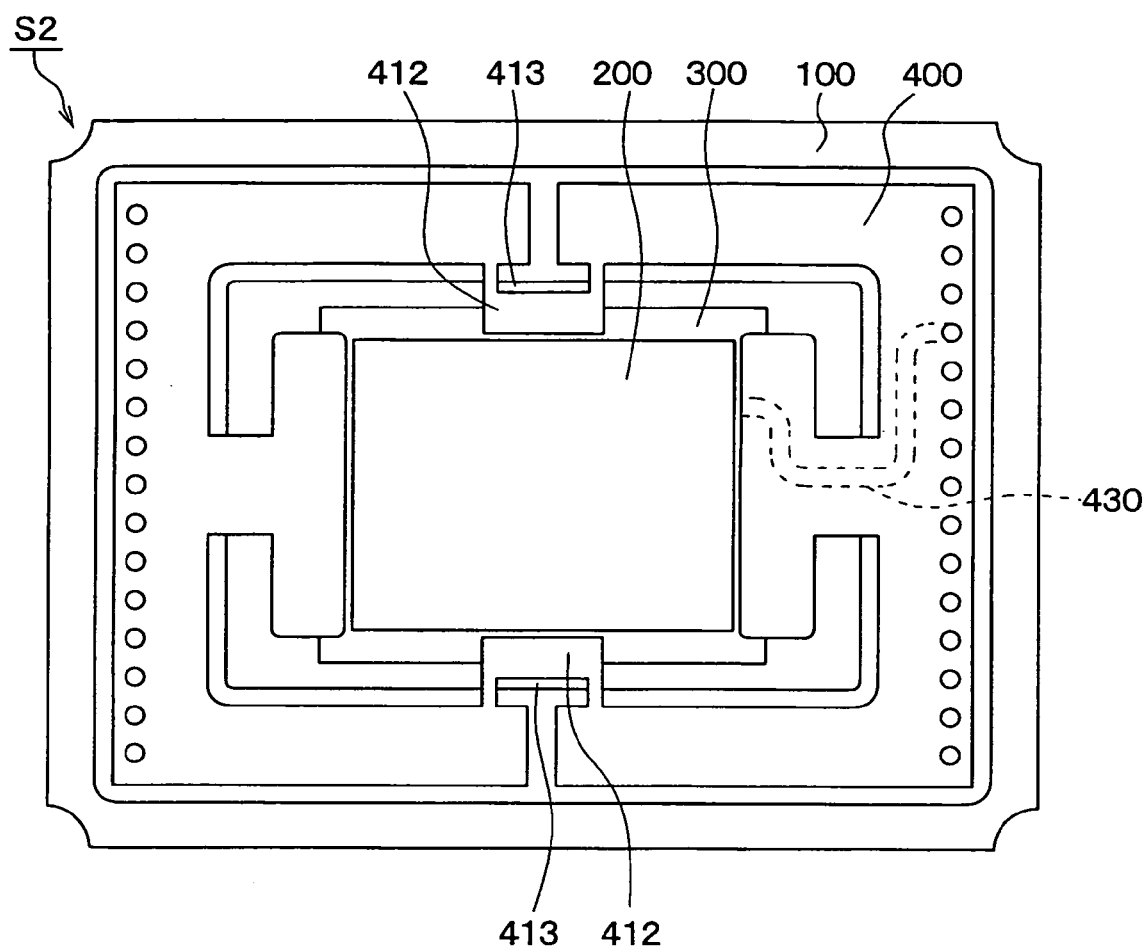
FIG. 5 is a plan view showing a angular velocity sensor according to a second embodiment of the present invention.
Figure 6A:
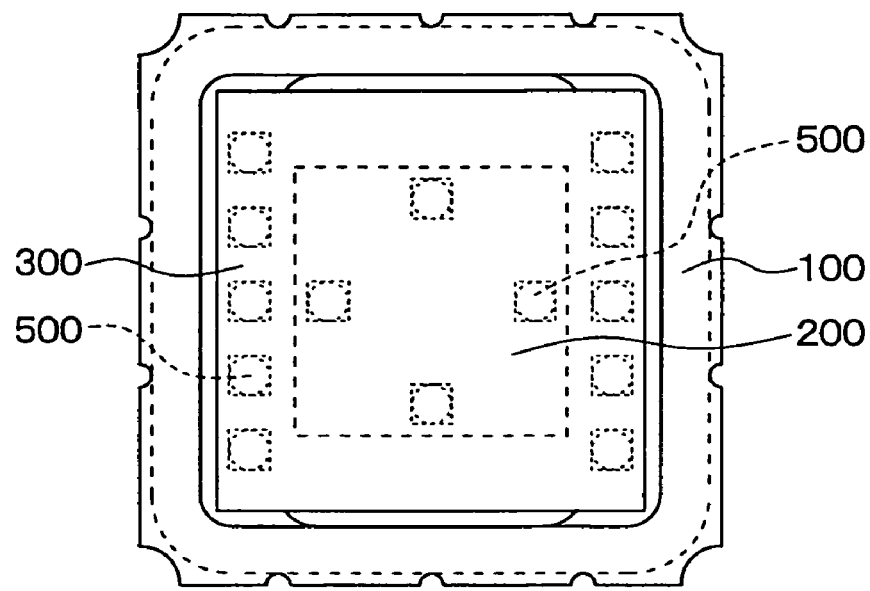
FIG. 6A is a plan view showing a physical quantity sensor as a prototype prepared by the inventor.
Figure 6B:
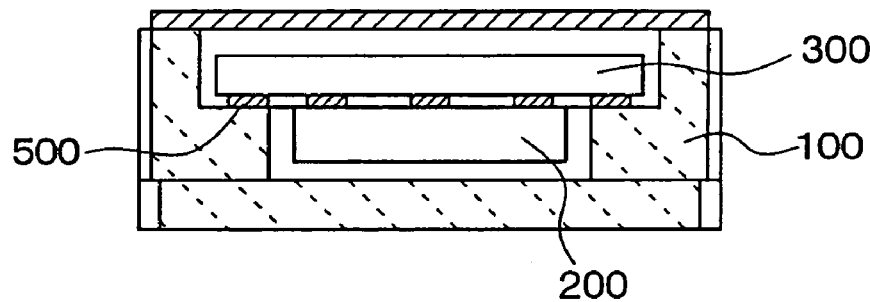
FIG. 6B is a cross sectional view showing the prototype.

FIG. 5 shows an angular velocity sensor S2 according to a second embodiment of the present invention.

In the sensor S1 shown in FIG. 1A, a carrier tape for a TAB method is used as the wiring member 400, which includes the flexible tape 410 and multiple leads 420 bonded on the flexible tape 410.

In the sensor S2, a flexible printed circuit board is used as a wiring member 400. The flexible printed circuit board is well-known and manufactured by forming wiring patterns 430 on a flexible substrate. The wiring patterns 430 and the flexible substrate are typically made of copper (Cu) foil and polyimide, respectively. The flexible printed circuit board is flexible as a whole.

The wiring member 400 is formed of a flexible printed board and used after being cut to the shape shown in FIG. 5.

A broken line in FIG. 5 represents a part of the wiring pattern 430 of the wiring member 400. The wiring pattern 430 is made of a copper foil.

Similar to in the sensor S1, a circuit chip 300 and a package 100 are electrically and mechanically bonded through the wiring member 400. Therefore, the sensor S2 can have the same action and effect as the sensor S1.

MODIFICATIONS

In the above-described embodiment, the sensor chip 200 and the circuit chip 300 are bonded through the bumps 500 by flip-chip bonding. Alternatively, the sensor chip 200 and the circuit chip 300 can be bonded with bonding wires after they are stacked.

The present invention can be applied to physical quantity sensors other than an angular velocity sensor, such as an acceleration sensor and a pressure sensor. In this case, the sensor chip 200 for detecting angular velocity can be replaced with an acceleration sensor chip or a pressure sensor chip.

Such changes and modifications are to be understood as being within the scope of the present invention as defined by the appended claims.

What is claimed is:

1. A physical quantity sensor comprising:
   a package;
   a circuit chip disposed in the package;
   a sensor chip stacked on the circuit chip; and
   a wiring member having flexibility, through which the circuit chip and the package are electrically and mechanically bonded together,
   wherein the wiring member includes a flexible tape,
   wherein the circuit chip and the sensor chip are suspended by the wiring member so that that circuit chip and the sensor chip are separated from the package in a flexible manner,
   wherein the flexible tape has a perimeter fixed to the package, and
   wherein the physical quantity sensor is an angular velocity sensor.

2. The sensor according to claim 1, wherein
   the wiring member is disposed to enclose the circuit chip,
   the wiring member has an overhanging portion which projects from an inner edge of the wiring member toward the circuit chip, and
   the wiring member and the circuit chip are bonded together at the overhanging portion.

3. The sensor according to claim 2, wherein
   the overhanging portion of the wiring member has a slit.

4. The sensor according to claim 2, wherein
   the wiring member further includes a lead bonded on the flexible tape,
   the flexible tape has the overhanging portion, and
   the circuit chip and the package are mechanically bonded together through the overhanging portion and electrically bonded together through the lead.

5. The sensor according to claim 2, wherein
   the overhanging portion includes a rectangular body and a pair of beams, and
   the rectangular body is connected to the inner edge of the wiring member through the beams.

6. The sensor according to claim 4, wherein
   the package has a hollow and a stage defining the hollow,
   the circuit chip is disposed in the hollow, and
   the wiring member is disposed on the stage.

7. The sensor according to claim 1, wherein
   the wiring member further includes a plurality of overhanging portions; and
   the circuit chip has first, second, third, and fourth sides, the first and second sides being bonded to the circuit chip through the plurality of leads, and the third and fourth sides being bonded to the circuit chip through the plurality of overhanging portions.

8. The sensor according to claim 7, wherein
   the first and second sides are opposed to each other, and
   the third and fourth sides are opposed to each other.

9. The sensor according to claim 7,
   wherein the sensor chip has first and second movable axes, and
   wherein the first movable axis is parallel to the third and fourth sides of the circuit chip.

* * * * *